United States Patent [19]

Morrison et al.

[11] Patent Number: 4,895,523

[45] Date of Patent: Jan. 23, 1990

[54] CONTROLLED IMPEDANCE CONNECTOR

[75] Inventors: Brian D. Morrison, Hopkinton; Jack J. Rosenberg, Acton, both of Mass.

[73] Assignee: Raytheon Company, Lexington, Mass.

[21] Appl. No.: 268,146

[22] Filed: Nov. 7, 1988

[51] Int. Cl.4 ............................................. H01R 23/68
[52] U.S. Cl. ...................................... 439/67; 439/493
[58] Field of Search ..................................... 439/59–62, 439/64, 65, 67, 77, 259, 260, 493, 496, 329, 325

[56] References Cited

U.S. PATENT DOCUMENTS

| | | | |
|---|---|---|---|
| 3,177,103 | 4/1965 | Tally et al. | 156/3 |
| 3,466,206 | 9/1969 | Beck | 156/3 |
| 3,701,964 | 10/1972 | Cronin | 339/17 F |
| 3,740,698 | 6/1973 | Jerominek | 339/17 F |
| 4,012,093 | 3/1977 | Crane | 339/17 F |
| 4,125,310 | 11/1978 | Reardon, II | 339/92 M |
| 4,453,795 | 6/1984 | Moulin | 339/92 M |
| 4,744,764 | 5/1988 | Rubenstein | 439/77 |
| 4,798,541 | 1/1989 | Porter | 439/493 |

OTHER PUBLICATIONS

IBM Bulletin, Abbatecola, vol. 10, No. 10, p. 1462, 3-1968.

Primary Examiner—Neil Abrams
Attorney, Agent, or Firm—Walter F. Dawson; Richard M. Sharkansky

[57] ABSTRACT

A very high density, multiple contact connector has low-inductance power and ground planes and gold dot contacts for providing a controlled impedance environment to a module assembly by minimizing undesirable effects such as ground-noise and reflections while assuring operation at interconnect bandwidths up to 6 GHz. The controlled impedance connector connects two printed wiring boards (PWBs) comprising surface mounted devices to a motherboard. The PWBs are bonded to opposite sides of a central heat frame. The connector has two flexible circuits containing a total of 460 gold dot signal connections plus a plurality of separate gold dot power and ground connections. Signal runs between the PWBs and the connector flexible circuits are interconnected using copper fingers soldered to pads on the PWBs. Power and ground planes connect to the PWBs via gold dot contacts on the inside of the flexible circuit surface to pads on the PWBs. The connector is a true zero insertion force design. A clamping mechanism comprising jacking screws pulls the spring-loaded gold dots on the flexible circuit of the connector against the pads on a motherboard. A clamping force of 200 pounds is used to achieve the required connector to motherboard interconnect pressure.

17 Claims, 3 Drawing Sheets

4,895,523

CONTROLLED IMPEDANCE CONNECTOR

BACKGROUND OF THE INVENTION

This invention relates to electrical signal connectors and in particular to an improved connector for handling very high speed signals, having very high interconnect bandwidths and ultra high signal densities.

Present high-bandwidth packaging designs for very high speed integrated circuits (VHSIC) and other technologies comprise the use of a double sided module assembly with printed wiring boards (PWBs) bonded to opposite sides of a central heat frame. The use of a double sided module assembly and the need for high packaging density necessitates a surface mount approach to PWB construction. Existing surface mountable connector systems, especially from military application suppliers for FORMAT-E modules defined in the Navy Standard Hardware Acquisition and Reliability Program (SHARP), are limited to 304 I/0 pins; however, the number of pins available per PWB is exactly one-half of this number, since one-half of the pins must be dedicated to each PWB and pins are not typically shared between PWBs. In addition, a considerable number of pins (25 to 30) are required to bring power to the module assembly while a greater number (50 to 60) are required to insure a good low impedance ground connection for the module assembly due to the high switching currents, the large number of I/0 signals, and the use of high speed integrated circuit technologies. This results in a large reduction in the number of pins actually available for I/0 signal usage. Signal interconnections on and off the module assembly are accomplished using blade and tuning fork, pin and socket or other friction type contact interfaces with a best-case pad pitch of 40 mils, resulting in an I/0 density of 25/inch and a connector contact count in the 100 to 300 range.

Another type of connector assembly is shown in a patent to Norbert L. Moulin, U.S. Pat. No. 4,453,795, "Cable-to-Cable/Component Electrical Pressure Wafer Connector Assembly," assigned to Hughes Aircraft Co., El Segundo, CA. Moulin describes an approach of making interconnections without the use of conventional frictionally engaging electrical connectors. Instead, for terminating at least 2 cables, or one cable to one component which have identical configurations, metallic buttons are formed on the contact pads of one termination so that when the terminations are placed opposing each other and pressed between two pressure plates or surfaces, connections are made between the respective contact pads of the terminations by means of the buttons. Further, placed between the pressure surfaces is a compression pad of elastomeric material which may be confined or unconfined, as desired. If not confined, the compression pad acts as both the means for evenly distributing the pressure between the terminations and to afford a gas-tight contact therebetween without deforming the buttons beyond their elastic limit. When confined, a spring relief is additionally included to control the force of pressure so as to permit a larger pressure to be exerted between the pads when a large number of contacts or buttons are utilized. This approach reduces the area required for each signal when applied to a connector assembly, thereby supporting gains made by increasing packaging density within a module assembly.

However, next generation packaging for advanced VHSIC and other high speed technology applications will have to accommodate higher clock rates, higher interconnect bandwidths, and I/0 signal density approaching 50/inch requiring connector contact counts in the 400 to 500 range.

SUMMARY OF THE INVENTION

In accordance with the present invention a controlled impedance connector is provided for accommodating very high frequency technologies and ultra high I/0 density. The connector comprises a housing for attaching the connector to a component board and for securing the connector to a mating means such as a motherboard, pressure bars inserted into a mating end of the housing for distributing load forces over a surface of the mating end of the connector, a plurality of springs disposed between an inside surface of the housing and the pressure bars for providing the load forces, and a pair of flexible circuits attached to the housing and the component board for making a plurality of power, ground and I/0 signal electrical contacts between the component board and the mating means, the flexible circuits comprising a plurality of conductive planes for distributing power and ground currents and a plurality of conductive strips for distributing the I/0 signals. The flexible circuits further comprise a plurality of high density gold dot contacts disposed on a mating end of the flexible circuits for making electrical contact with conductive pads on the mating means. The gold dots provide high density electrical contacts for the power and ground planes and the signals at the mating end of the flexible circuits without any reduction in a maximum number of gold dots available for I/0 signals. The flexible circuits further comprise a first layer of parallel conductive planes for power and ground and a second layer of conductive strips for I/0 signals with a dielectric material separating the first layer and the second layer. The gold dots are also disposed on the parallel conductive planes for providing electrical contact between the conductive planes and the component board.

The housing of the controlled impedance connector comprises at least two threaded holes for inserting a jacking screw into each hole to contiguously mate the connector to the mating means. The connector further comprises a clamping bar for pressing the gold dot contacts on the conductive planes of the flexible circuits against conductive means on the component board to make good electrical contact. Each flexible circuit forms a U-shape around the housing means with the conductive planes disposed on each inner side of the U-shaped flexible circuit. A central heat frame having printed wiring boards mounted on each side and a controlled impedance connector attached at one end of the boards forms a module assembly.

In accordance with a further feature of the invention, a method is provided for implementing a controlled impedance connector having very high interconnect bandwidths comprising the steps of providing a housing means for attaching the connector to a component board and for securing the connector to a mating means such as a motherboard, inserting pressure bars into a mating end of the housing for distributing load forces over a surface of the mating end of the connector, disposing a plurality of springs between an inside surface of the housing and the pressure bars for providing the load forces, and attaching a pair of flexible circuits to the housing means and the component board for making a plurality of power, ground and I/0 signal electrical contacts between the component board and the mating means, the flexible circuits comprising a plurality of conductive planes for distributing power and ground currents and a plurality of conductive strips for distributing I/0 signals. The method further comprises the step of disposing on a mating end of each of the flexible circuits a plurality of high density gold dot contacts for making electrical contact with conductive pads on the mating means, the maximum number of the gold dot contacts being available for I/0 signals without any reduction for accommodating the power and ground plane connections. The method further comprises the step of fabricating flexible circuits to have a first layer of conductive planes for power and ground connections and a second layer of conductive strips for I/0 signal connections and separating said first layer and said second layer with a dielectric material.

DESCRIPTION OF THE PREFERRED EMBODIMENT

Figure 1:
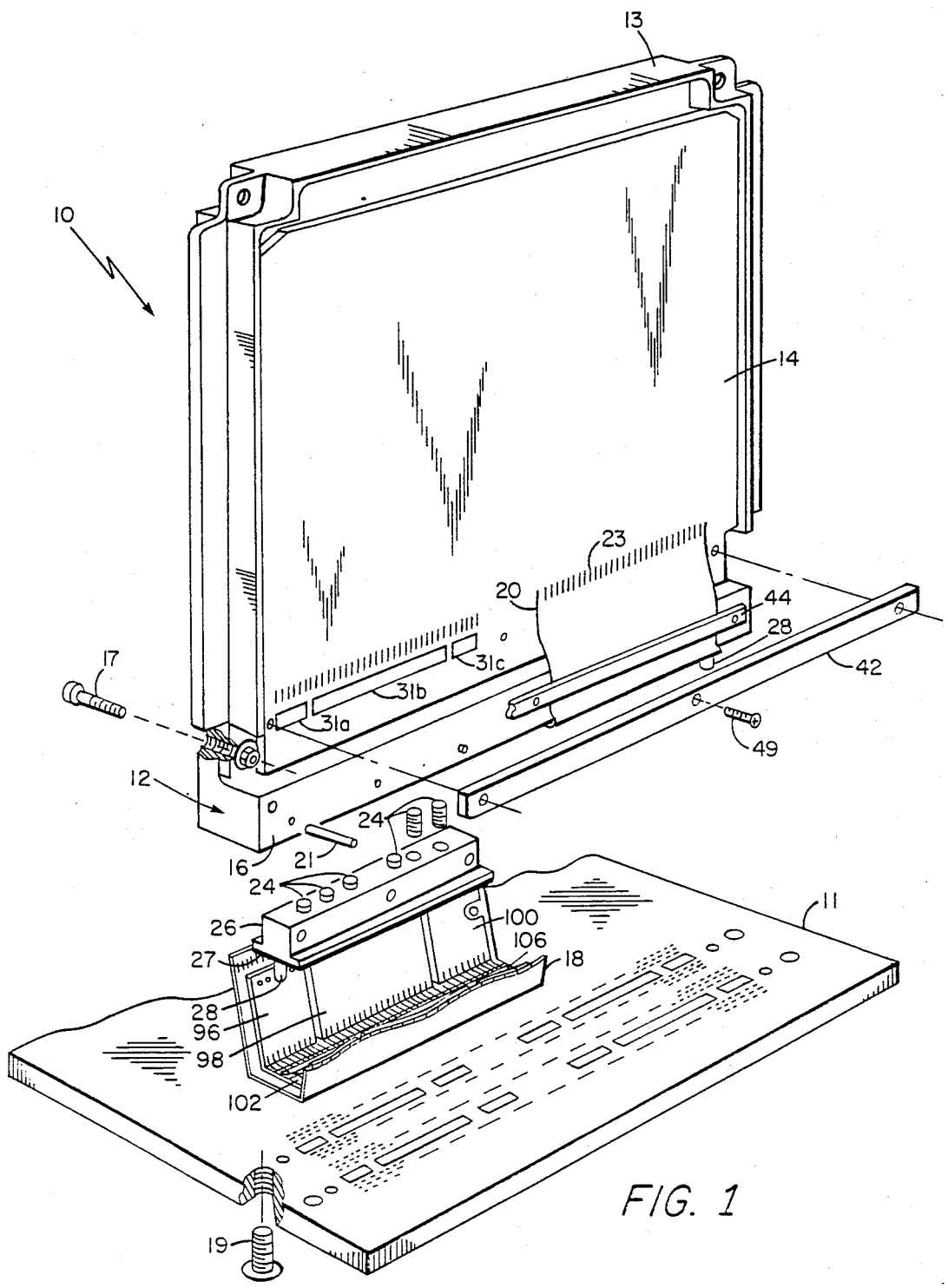
FIG. 1 is a partially exploded isometric illustration of the invention showing two flexible circuits each having integral power and ground planes for providing a controlled impedance connector.

Referring now to FIG. 1 there is shown a partially exploded illustration of a FORMAT-E type module 10 having controlled impedance connector 12 comprising two printed wiring boards (PWBs) 14, 15 bonded to opposing sides of a central heat frame 13 with the central heat frame being the attachment point of a controlled impedance connector 12 for providing input-output I/0 signals and power and ground connections to and from very high speed integrated circuits (VHSIC) or other high speed logic devices not shown but known to one skilled in the art and normally surface mounted on the PWBs 14,15. The FORMAT-E module 10 with the controlled impedance connector 12 is intended for advanced VHSIC and gallium arsenide (GaAs) applications having clock rates of 25 to 1000 MHz and interconnect bandwidths of up to 6 GHz. The controlled impedance connector 12 provides a controlled impedance environment which minimizes undesireable efforts such as ground-noise and reflections, and it is a very high density multiple contact connector comprising 460 gold dots for I/0 signals excluding power and ground requirements where a gold dot is the functional equivalent of a blade in a common blade and tuning fork connector; the connector 12 has additional gold dots for the power and ground connections to and from parallel power and ground planes 96,98,100 in accordance with the present invention. Two U-shaped two-sided flexible circuits 18,20 comprising low-inductance power and ground planes 96-100 which exist on both inner sides of the "U" provide the 460 I/0 signal contacts plus separate power and ground connections between devices on PWBs 14,15 and a motherboard 11. The U-shaped flexible circuits wrap-around a housing 16 that attaches by jacking screws 17 to the central heat frame 13. The exposed copper finger ends 23 (10 mil wide on 20 mil centers) of the U-shaped flexible circuit 18,20 are soldered to PWBs 14, 15.

Figure 2:
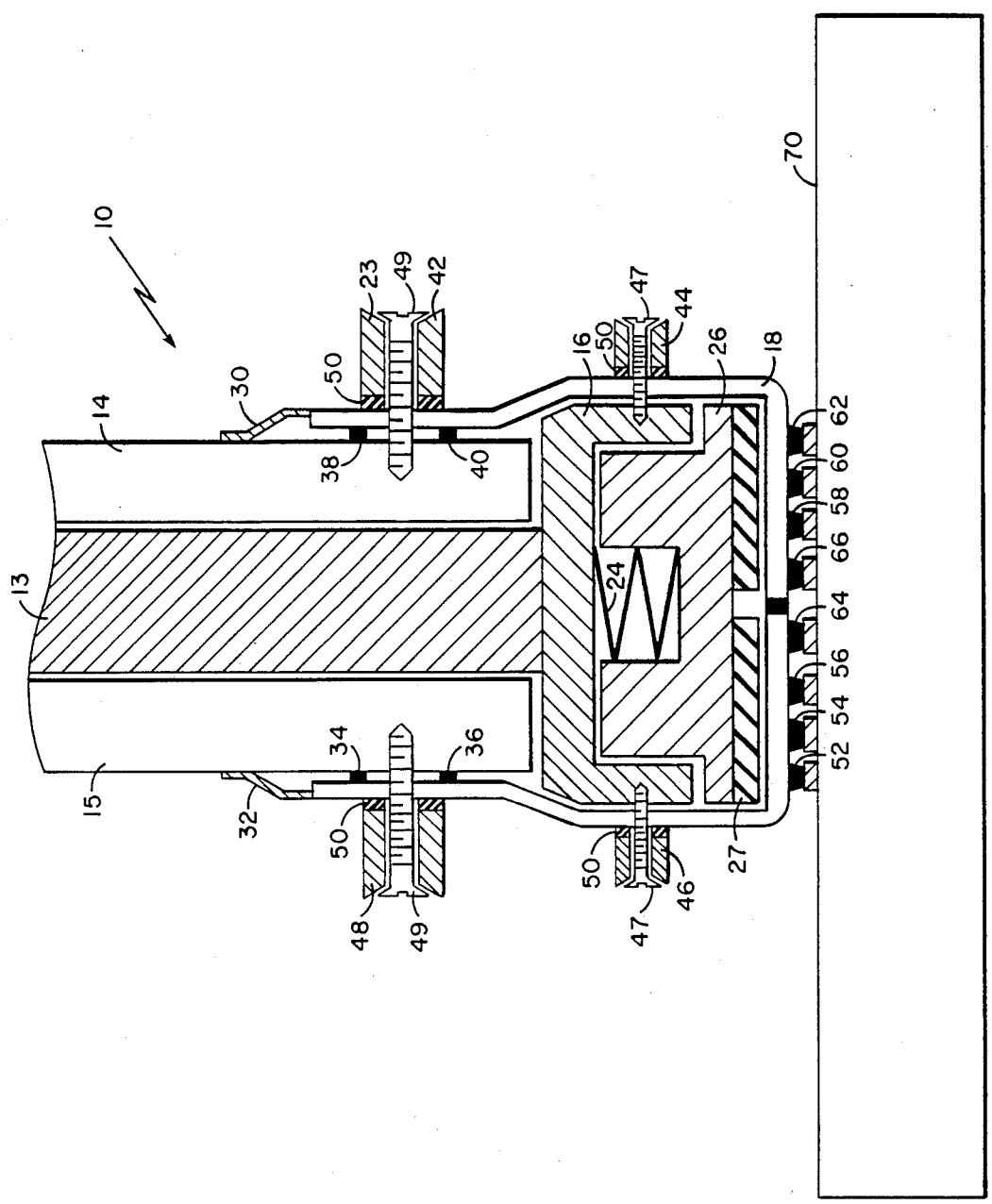
FIG. 2 is a cross-sectional view of the controlled impedance connector of FIG. 1.

Referring now to FIG. 1 and also FIG. 2 which shows a cross-sectional view of the controlled impedance connector 12, the bottom of the housing 16 has two pressure bars 26 each having a plurality of springs 24 for maintaining even pressure behind each flexible circuit 18,20 when the connector 12 is mated to the motherboard 11. A silicone rubber elastomer backing 27 is attached to the surface of the pressure bar 26 that comes in contact with the flexible circuit 18,20 for distributing loads evenly on the connector gold dots. The elastomer backing 27 is relieved in the immediate vicinity of plated-through-holes to reduce stress on the barrels. Two pressure plates 44,46 secure the flexible circuits 18,20 against the housing 16 on each side and another set of pressure plates 42,48 secure the power and ground dots 34–40 on the inside surface of the flexible circuits 18,20 to the power and ground plane strips 31a, 31b, 31c on each of the PWBs 14,15. The sides of the pressure plates 42–48 making contact with the flexible circuits 18,20 have a silicone rubber elastomer backing 50 attached to such sides.

Figure 3:
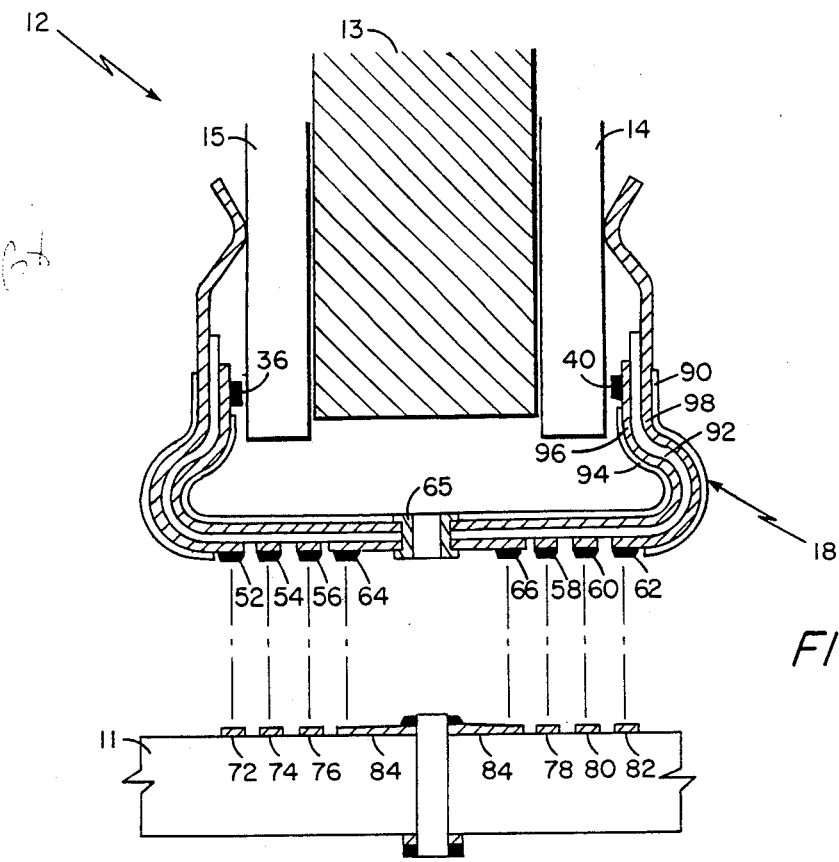
FIG. 3 is a cross-sectional view of the flexible circuit 18 shown in FIG. 1.

Referring now to FIG. 1 and FIG. 3, a cross-sectional view of the flexible circuit 18 is shown in FIG. 3 comprising a power and ground plane layer 96 and a signal layer 98. The outside layers 90,94 of the flexible circuit 18 comprise a dielectric material such as a polyimide as well as the inside layer 92 between the two conductive layers 96 and 98. The power and ground plane layer 96 is coupled to dots 64,66 via a plated-through-hole 65. When the connector 12 is mated to a motherboard 11 by fastening means such as jacking screws 19 in the motherboard 11, the connector 12 is pulled down such that the ends of the connector housing 16 are flush with the motherboard 11, resulting in the signal dots 52–62 contacting pads 72–82 respectively on the motherboard 11 and power and ground plane gold dots 64,66 contacting a solid plane 84 on the motherboard 11 coated with a similar metal as the dots. A combined force of approximately 200 pounds is attained by the springs 24 in each of the pressure bars 26 for the flexible circuits 18,20; the pressure bars 26 spread the force evenly over all of the dot contacts. The relatively low forces from the spring loaded pressure bar 26 in the connector housing cause a very high force at the connector interface which results in a gas tight joint. The connector 12 dot contacts are aligned for mating with a motherboard 11 by solid steel pins 28 protruding from the connector housing 16 which precisely locates the two flex-print circuits 18,20 to the motherboard 11. The controlled impedance connector 12 is a true zero insertion force apparatus.

Referring to FIG. 1 three solid copper planes 96,98 and 100 in parallel are shown on one internal side of the U-shaped flexible circuit 18 and similar copper planes exist on the other internal side with thin copper fingers interconnecting the corresponding facing copper planes at the bottom of the U-shaped flexible circuit. The fingers facilitate the bending of the flexible circuits 18,20 forming a U-shape. Each of the solid copper planes 96,98,100 may be used for power or ground connections depending on the application requirements. These planes 96–100 serve to provide a distributed current sheet which is essential in maintaining a low inductance path between the module 10 and the motherboard 11. At frequencies of 100 MHz and above, inductance due to what is known as "skin effect" is the predominant impedance component of a copper plane. The origin of the term skin effect or skin depth lies in the fact that time-varying fields and current densities exist only in a thin layer on the surface of a good conductor. The surface impedance of copper is primarily an inductive reactance at higher frequencies; hence, adding thickness to the copper has little effect upon the impedance of a plane. The greatest benefit is therefore achieved by a maximum surface area solid copper plane which is several skin depths in thickness. The minimum acceptable copper plane thickness for such shielding is determined by the minimum coupling frequency of interest. The harmonics of a digital signal are particularly important; the edge-rate frequencies are more important than cycle-time derivatives, since all coupling occurs on the signal edges particularly the rising edge.

Figure 4:
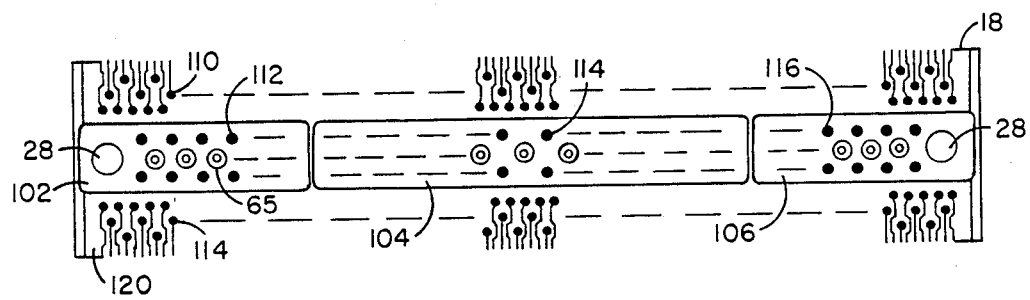
FIG. 4 is a view of the signal, power and ground gold dots on a surface of a flexible circuit of the controlled impedance connector that mates with a motherboard to accomplish interconnections.

Referring now to FIG. 1 and FIG. 4, the flexible circuits 18,20 comprising the integral power and ground planes 96,98,100 are manufactured by Hughes Aircraft Company, Connecting Devices Division of Irvine, CA. The connector gold dots, 110, 112, 114 on the flexible circuit 18 eliminate conventional pin and socket contacts or blade and tuning fork contacts resulting in a low profile surface mount connector capable of densities far in excess of conventional connector systems. FIG. 4 illustrates the connecting gold dots on the end mating surface 120 of one flexible circuit 18. There are 115 gold dots in the upper area comprising gold dot 110 and another 115 gold dots in the lower area comprising gold dot 114; these gold dot connections are used for I/0 signals. The gold dots in areas 102, 104 and 106 are connected to planes 96, 98 and 100 respectively by plated through holes 65. The areas 102, 104 and 106 provide the plurality of power and ground connection points without using any of the signal gold dots. The plated-through-holes 65 provide the means for transferring ground and power connections through the flexible circuit 18 for connecting to the PWB 14,15. Solid steel pins 28 protruding from the connector housing 16 precisely locate the flexible circuit 18 for mating to a motherboard 11. The dot performing the electrical contact is formed by a column of gold deposited 2 to 4 mils high onto the end mating surface 120 of the flexible circuit 18. The mating surface is a gold plated pad on the motherboard 11 mating circuit.

This concludes the description of the preferred embodiment. However, many modifications and alterations will be obvious to one of ordinary skill in the art without departing from the spirit and scope of the inventive concept. Therefore, it is intended that the scope of this invention be limited only by the appended claims.

What is claimed is:

1. A high density controlled impedance connector comprising:
    means for providing a housing for said connector, said housing means provides for attaching said connector to a component board means and for securing said connector to a mating means;
    pressure bar means inserted into an end of said housing means for distributing load forces over a surface of a mating end of said connector;
    spring means disposed between an inside surface of said housing means and said pressure bar means for providing said load forces; and
    flexible circuit means attached to said housing means and said component board means for making a plurality of power, ground and I/O signal electrical contacts between said component board means and said mating means; and
    said flexible circuit means comprises a first layer of a plurality of power and ground conductive planes in parallel for providing a low inductance current path between said component board means and said mating means and a second layer of conductive strips for said I/O signals with a dielectric material means separating said first layer and said second layer.

2. The controlled impedance connector as recited in claim 1 wherein:
    said flexible circuit means comprises a plurality of high density gold dot contact means disposed on a mating end of said flexible circuit means for making electrical contact with conductive pads on said mating means.

3. The controlled impedance connector as recited in claim 2 wherein:
    said gold dot contact means provides high density electrical contacts for said power and ground planes and I/O signals at said mating end of said flexible circuit means without any reduction in a maximum number of said gold dots available for said I/O signals.

4. The controlled impedance connector as recited in claim 1 wherein:
    said flexible circuit means comprises gold dot contact means disposed on said parallel conductive planes for providing electrical contact of said power and ground planes to said component board means.

5. The controlled impedance connector as recited in claim 4 wherein:
    said connector comprises means for pressing said gold dot contact means disposed on said conductive planes in said flexible circuit means against conductive means on said component board means to make electrical contact.

6. The controlled impedance connector as recited in claim 1 wherein:
    said housing means of said connector comprises at least two threaded holes for inserting a jacking screw into each hole to contiguously mate said connector to said mating means.

7. The controlled impedance connector as recited in claim 1 wherein:
    said flexible circuit means forms a U-shape around a base of said housing means having a pressure bar in contact with said flexible circuit means, said conductive planes being disposed on each inner side of said U-shaped flexible circuit means.

8. A module assembly having a high density controlled impedance connector comprising:
    a frame means for attaching a component board means and said connector;
    means for providing a housing for said connector, said housing means provides for attaching said connector to said component board means and for securing said connector to a mating means;
    pressure bar means inserted into an end of said housing means for distributing load forces over a surface of a mating end of said connector;
    spring means disposed between an inside surface of said housing means and said pressure bar means for providing said load forces; and
    flexible circuit means attached to said housing means and said component board means for making a plurality of power, ground and I/O signal electrical contacts between said component board means and said mating means; and said flexible circuit means comprises a first layer of a plurality of power and ground conductive planes in parallel for providing a low inductance current path between said component board means and said mating means and a second layer of conductive strips for said I/O signals with a dielectric material means separating said first layer and said second layer.

9. The module assembly as recited in claim 8 wherein:

said flexible circuit means comprises a plurality of high density gold dot contact means disposed on a mating end of said flexible circuit means for making electrical contact with conductive pads on said mating means.

10. The module assembly as recited in claim 9 wherein:

said gold dot contact means provides high density electrical contacts for said power and ground planes and I/O signals at said mating end of said flexible circuit means without any reduction in a maximum number of said gold dots available for said I/O signals.

11. The module assembly as recited in claim 8 wherein:

said flexible circuit means comprises gold dot contact means disposed on said parallel conductive planes for providing electrical contact of said power and ground planes to said component board means.

12. The module assembly as recited in claim 11 wherein:

said connector comprises means for pressing said gold dot contacts disposed on said conductive planes in said flexible circuit means against conductive means on said component board means to make electrical contact.

13. The module assembly as recited in claim 8 wherein:

said housing means of said connector comprises at least two threaded holes for inserting a jacking screw into each hole to contiguously mate said connector to said mating means.

14. The module assembly as recited in claim 8 wherein:

said flexible circuit means forms a U-shape around a base of said housing means having a pressure bar in contact with said flexible circuit means, said conductive planes being disposed on each inner side of said U-shaped flexible circuit means.

15. A method for providing a high density controlled impedance connector having very high interconnect bandwidths comprising the steps of:

providing a housing means for said connector, said housing means provides for attaching said connector to a component board means and for securing said connector to a mating means;

inserting pressure bar means into an end of said housing means for distributing load forces over a surface of a mating end of said connector;

disposing spring means between an inside surface of said housing means and said pressure bar means for providing said load forces; and attaching a flexible circuit means to said housing means and said component board means for making a plurality of power, ground and I/O signal electrical contacts between said component board means and said mating means; and fabricating said flexible circuit means to have a first layer of a plurality of power and ground conductive planes in parallel for providing a low inductance current path between said component board means and said mating means and a second layer of conductive strips for conducting said I/O signal connections, said first layer and said second layer being separated with a dielectric material means.

16. The method as recited in claim 15 wherein:

said method further comprises the step of disposing on a mating end of said flexible circuit means a plurality of high density gold dot contact means for making electrical contact with conductive pads on said mating means.

17. The method as recited in claim 16 wherein:

said step of disposing said high density gold dot contact means on said mating end of said flexible circuit means provides for a maximum number of said gold dots to be available for said I/O signals without any reduction for accommodating power and ground plane connections.

* * * * *